United States Patent [19]
Hirai

[11] Patent Number: 5,126,809
[45] Date of Patent: Jun. 30, 1992

[54] SEMICONDUCTOR NON-VOLATILE MEMORY

[75] Inventor: Yoshio Hirai, Tokyo, Japan

[73] Assignee: Seiko Instruments & Electronics Ltd., Japan

[21] Appl. No.: 279,231

[22] Filed: Nov. 29, 1988

Related U.S. Application Data

[63] Continuation of Ser. No. 914,125, Oct. 1, 1986, abandoned.

[30] Foreign Application Priority Data

Oct. 15, 1985 [JP] Japan ................................ 60-229403

[51] Int. Cl.⁵ ............................................. H01L 29/78
[52] U.S. Cl. .................................... 357/23.5; 357/6
[58] Field of Search ................... 357/23.5, 6

[56] References Cited
U.S. PATENT DOCUMENTS

| | | | |
|---|---|---|---|
| 4,099,196 | 7/1978 | Simko | 357/59 J |
| 4,503,519 | 3/1985 | Arakawa | 357/54 |

FOREIGN PATENT DOCUMENTS

| | | | |
|---|---|---|---|
| 0035160 | 2/1981 | European Pat. Off. | 357/23.5 |
| 0052982 | 6/1982 | European Pat. Off. | 357/23.5 |

*Primary Examiner*—Jerome Jackson, Jr.
*Attorney, Agent, or Firm*—Bruce L. Adams; Van C. Wilks

[57] ABSTRACT

A semiconductor non-volatile memory for use in a computer or the like has an erasing electrode and a writing electrode provided adjacent to a floating gate electrode through respective tunnel oxide films. Rewriting of the memory is effected by applying a strong electric field to each of the tunnel oxide films through the erasing and writing electrodes only in the forward direction so that it is difficult for the tunnel oxide film to break down worn due to the application of the electric field.

7 Claims, 3 Drawing Sheets

SEMICONDUCTOR NON-VOLATILE MEMORY

This is a Rule 62 continuation application of parent application Ser. No. 914,125 filed Oct. 1, 1986 now abandoned.

BACKGROUND OF THE INVENTION

The present invention relates to a semiconductor nonvolatile memory for use in a computer, an office automation machine or the like.

1. Field of the Invention

The present invention provides a semiconductor non-volatile memory for use in a computer or the like wherein an erasing electrode and a writing electrode are provided adjacent to a floating gate electrode through respective tunnel insulator films, thereby improving the reliability of the semiconductor non-volatile memory.

2. Description of the Prior Art

Semiconductor non-volatile memories are widely applied to computers and the like since they are smaller in size than other types of memory and enable a high-speed reading operation. FIG. 2 is a sectional view of a typical electrically erasable and programmable non-volatile memory (hereinafter referred to as an "EEPROM"). On the surface of a P-type semiconductor substrate 11, N+-type source and drain regions 12 and 13 are formed, and a floating gate electrode 15 is provided thereon through a gate insulator film 14. In addition, a control gate electrode 16 for controlling the potential of the floating gate electrode 15 is provided through an insulator film 102. The transfer of electric charge to and from the floating gate electrode 15 is effected through a tunnel oxide film 17 provided on the drain region 13. For example, in the case where the thickness of the tunnel oxide film 17 is about 200 Å, when a voltage which is 20V higher than the potential of the drain region 13 is applied to the control gate electrode 16, a strong electric field is applied to the tunnel oxide film 17, causing electrons to flow from the drain region 13 into the floating gate electrode 15. To extract electrons out of the floating gate electrode 15 into the drain region 13 reversely to the above, it suffices to apply a voltage to the drain region 13 which is 20V higher than the potential of the control gate electrode 16. Since the channel conductance between the source and drain regions under the floating gate electrode 15 which serves as a gate electrode changes in accordance with the amount of electric charge accumulated or stored in the floating gate electrode 15, it is possible to read out data.

For example, this kind of prior art is disclosed in U.S. Pat. No. 4,203,158, entitled "ELECTRICALLY PROGRAMMABLE AND ERASABLE MOS FLOATING GATE MEMORY DEVICE EMPLOYING TUNNELING AND METHOD OF FABRICATING SAME" by Dov Frohman-Bentchkowsky, etal.

In the case of an EEPROM in which a strong electric field is applied to a tunnel oxide film to rewrite data as shown in FIG. 2, the application of a strong electric field leads to wear and deterioration of the tunnel oxide film, so that repetition of the rewriting operation results in breakdown of the EEPROM.

SUMMARY OF THE INVENTION

To solve the above-described problem, the deterioration of the tunnel oxide film due to wear examined carefully, and it has been found that the deterioration due to wear is dependent on the direction of the applied electric field. The results of the examination are shown in FIG. 3. The chart shows the tunnel current with respect to the electric field $E_{ox}$ applied to the tunnel oxide film 17. Breakdown of the tunnel oxide film takes place at a smaller current value when electrons flow out of the floating gate electrode 15 (when +20V is applied to the drain region; +$V_D$). In other words, the breakdown likely occurs in an EEPROM such as that shown in FIG. 2 during an erasing mode (when electrons flow out of the floating gate electrode 15).

On the basis of the above-described fact, the occurrence of breakdown of an EEPROM due to rewriting is suppressed by providing erasing and writing electrodes separately from each other.

By providing the erasing and writing electrodes separately from each other, the direction in which electrons flow through each tunnel insulator films of the is limited to only one direction, whereby the deterioration of the tunnel insulator films due to wear is suppressed.

DETAILED DESCRIPTION OF THE PREFERRED EMBODIMENT

Figure 1:
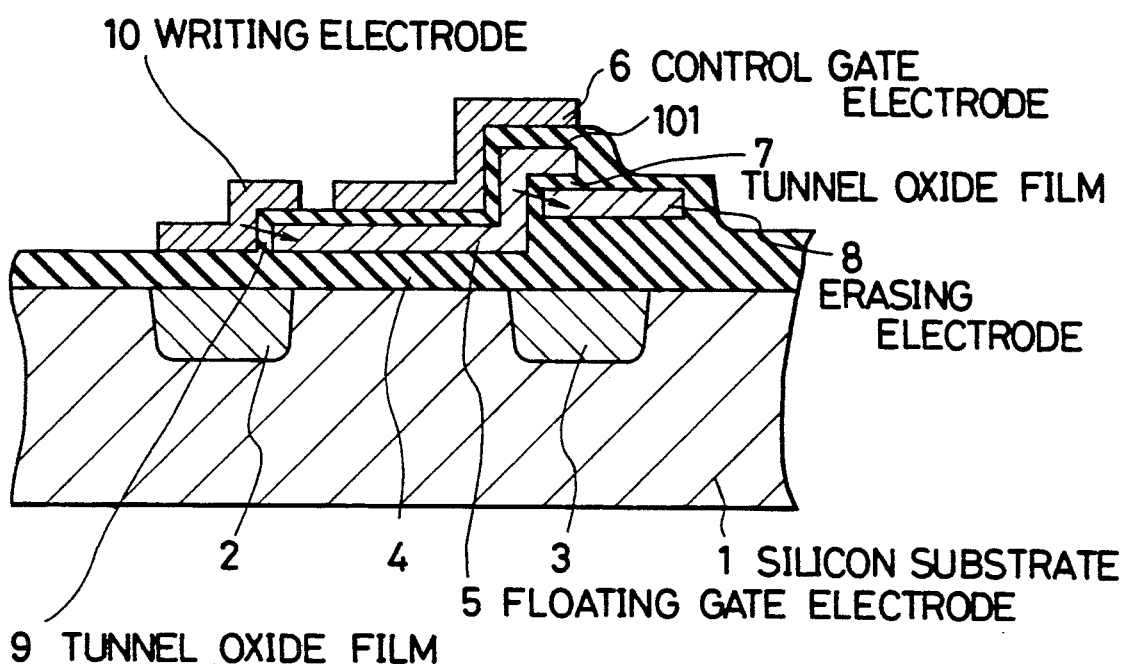
FIG. 1 is a sectional view of a first embodiment of the semiconductor non-volatile memory according to the present invention.
Figure 2:
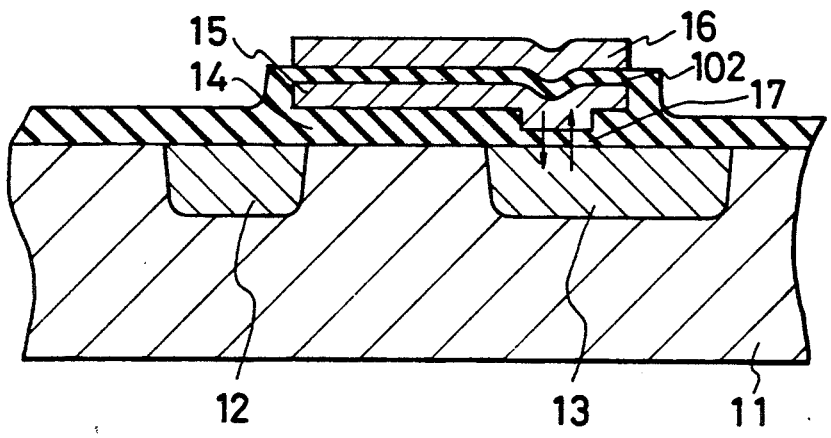
FIG. 2 is a sectional view of a conventional semiconductor non-volatile memory.
Figure 3:
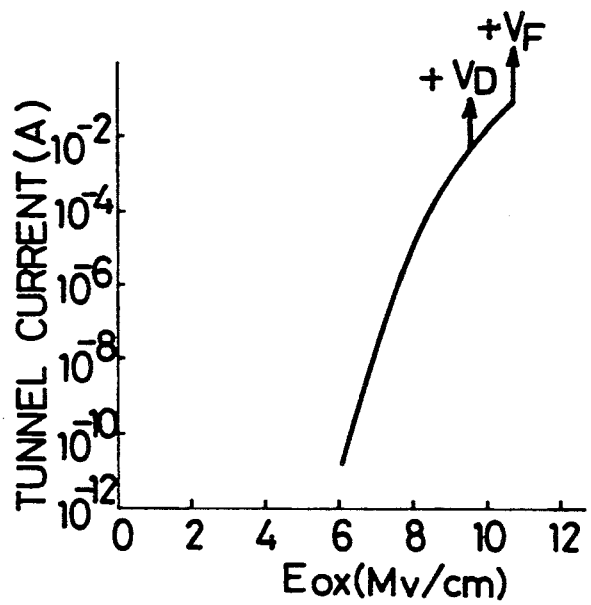
FIG. 3 is a chart showing the electric characteristics of the tunnel oxide film on N+-type single crystal silicon.

The semiconductor non-volatile memory of the multi-layer structure according to the present invention will be described hereinunder with reference to FIGS. 1, 4 and 5. A first embodiment of the semiconductor non-volatile memory according to the present invention shown in FIG. 1 will first be explained. On the surface of a P-type semiconductor substrate 1, N+-type source and drain regions 2, 3 are formed, and a floating gate electrode 5 is provided through a gate insulator film 4 on a channel region between the source and drain regions. In addition, a control gate electrode 6 is provided above the floating gate electrode 5 through an insulator film 101. An erasing electrode 8 for extracting electrons or electric charge from the floating gate electrode 5 is provided below or under the floating gate electrode 5 through a lower tunnel oxide film 7 disposed in contact with the lower major surface of the floating gate electrode 5. A writing electrode 10 is provided above or over the floating gate electrode 5 through an upper tunnel oxide film 9 disposed in contact with the upper major surface of the floating gate electrode 5. To effect writing (i.e., to inject electrons into the floating gate electrode 5 through the upper tunnel oxide film 9), a writing voltage is applied to the control gate electrode 6 and the erasing electrode 8 with respect to the writing electrode 10. To effect erasing, an erasing voltage is applied to the erasing electrode 8 with respect to the writing electrode 10 and the control gate electrode 6.

As shown in FIG. 1, in the case of the EEPROM according to the present invention, rewriting is effected by injecting electrons from the polysilicon of the third-level layer which constitutes the writing electrode 10 into the second-level layer polysilicon which constitutes the floating gate electrode 5 and by extracting electrons from the electrode 5 to the erasing electrode 8 which is constituted by the first-level layer polysilicon.

Figure 4:
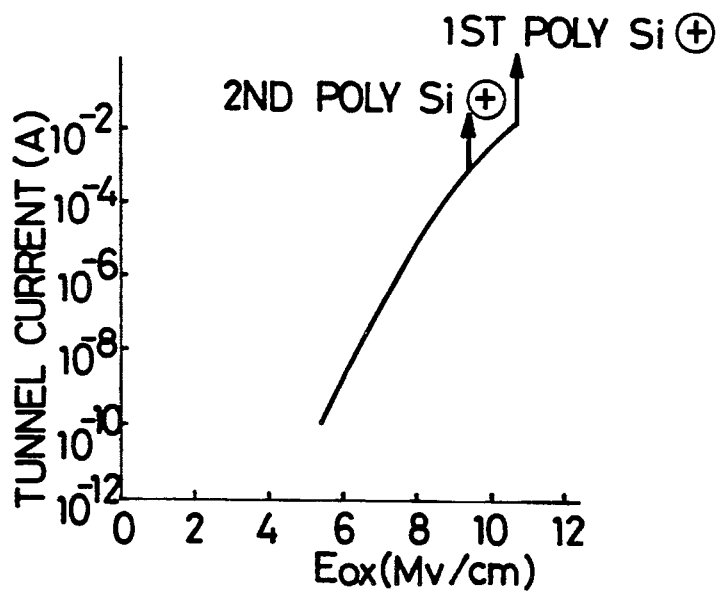
FIG. 4 is a chart showing the electric characteristics of the tunnel oxide films on polysilicon employed in the present invention.

FIG. 4 is a chart showing the breakdown electrice field characteristics of the tunnel oxide films employed in the present invention. The chart shows the tunnel current with respect to the applied electric field. As shown in FIG. 4, when about 11 Mv is applied to the first-level layer polysilicon or the erasing electrode 8 with respect to the second-level layer polysilicon or the floating gate electrode 5 across the tunnel oxide film 7 to flow electrons therethrough in the forward direction from the second-level layer polysilicon 5 to the first-level layer polysilicon 8 as shown by the arrow in FIG. 1, the tunnel oxide film 7 is broken down. On the other hand, when about 9 Mv is applied to the second-level layer polysilicon 5 with respect to the first-level layer polysilicon 8 across the tunnel oxide film 7 to flow electrons therethrough in the reverse direction, the tunnel oxide film 7 is broken down. It requires a greater voltage for the tunnel oxide film to break down (i.e., the tunnel oxide film exhibits a greater breakdown electric field characteristic) in the case where a positive voltage is applied to the first-level layer polysilicon than in the case where a positive voltage is applied to the second-level layer polysilicon. Accordingly, the structure shown in FIG. 1 enables the realization of an EEPROM in which the occurrence of breakdown due to rewriting is suppressed, since the erasing electrode 8 is arranged to extract the electrons from the floating gate electrode 5 through the tunnel oxide film 7 in the forward direction and the writing electrode 10 is arranged to inject the electrons into the floating gate electrode 5 through the tunnel oxide film 9 in the forward direction as shown by the arrows in FIG. 1.

Figure 5:
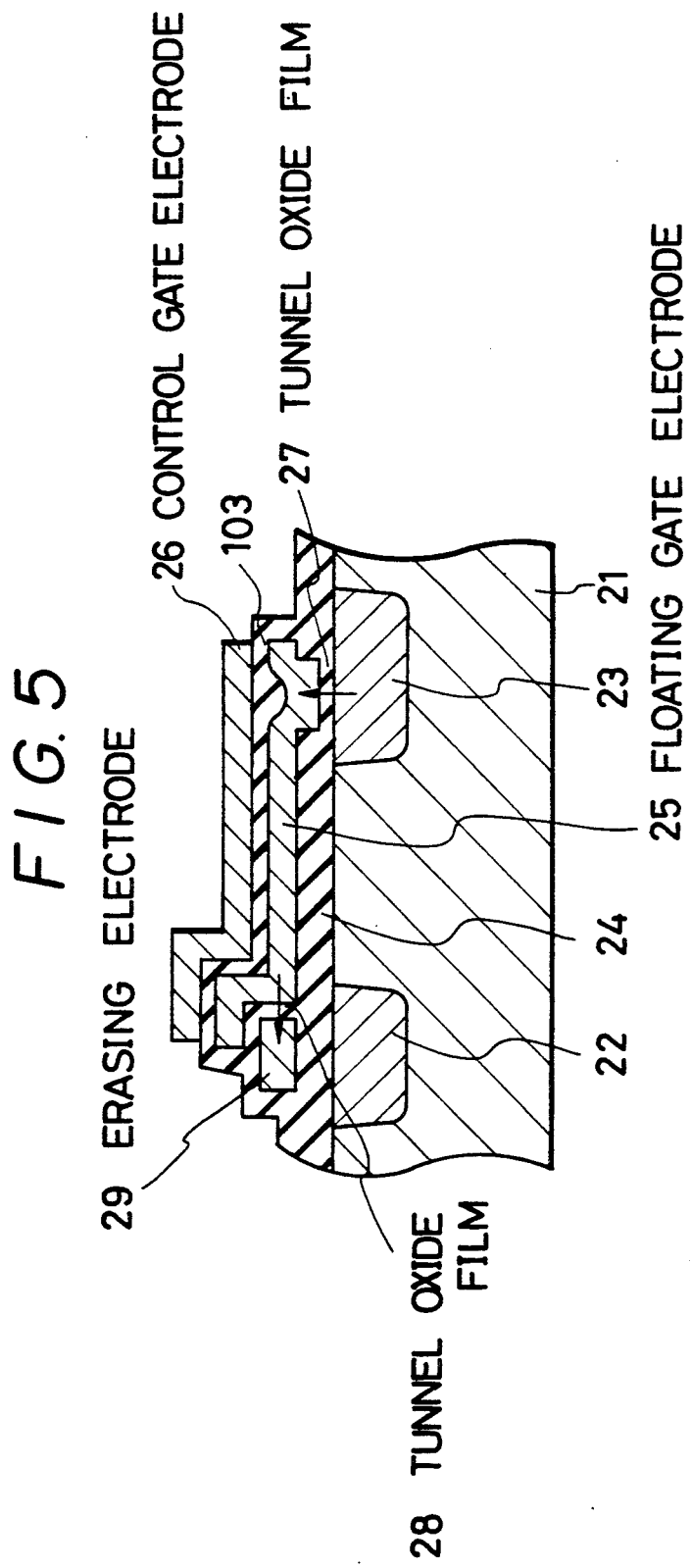
FIG. 5 is a sectional view of a second embodiment of the semiconductor non-volatile memory according to the present invention.

FIG. 5 shows a second embodiment of the semiconductor non-volatile memory according to the present invention. In this embodiment, rewriting is effected by injecting electrons from a drain region 23 into a floating gate electrode 25 through a tunnel oxide film 27 and by extracting the electrons from the electrode 25 to an erasing electrode 29 through a tunnel oxide film 28. Thus, the second embodiment has a structure in which rewriting is carried out by applying a strong electric field to each of the tunnel oxide films 27 and 28 only in the forward direction so that it is difficult for the tunnel oxide film to break down as shown by the arrows in FIG. 5.

The semiconductor non-volatile memory according to the present invention has a structure in which two tunnel oxide films are provided so that rewriting is effected by applying a strong electric field to each of the tunnel oxide films only in the forward direction in which it is difficult for the tunnel oxide film to become worn due to the application of the electric field. It is therefore possible to realize a semiconductor non-volatile memory which can endure a number of times of rewriting which is one or more digits larger than that in the case of the conventional structure.

What is claimed is:

1. A semiconductor non-volatile memory comprising:
a semiconductor substrate of a first conductivity type;
source and drain regions of a second conductivity type formed in the surface of the semiconductor substrate and spaced apart from each other;
a floating gate electrode formed on the surface of the semiconductor substrate between the source and drain regions through a gate insulator film;
an erasing electrode provided in opposed relation to the floating gate electrode with a first tunnel insulator film therebetween and operative to receive electric charges emitted from the floating gate electrode during an erasing operation, a portion of the erasing electrode being positioned under a portion of the floating gate electrode, as viewed from the surface of the semiconductor substrate, in overlapping relation therewith; and
a writing electrode provided in opposed relation to the floating gate electrode with a second tunnel insulator film therebetween and operative to inject electric charges into the floating gate electrode during a writing operation, a portion of the writing electrode being positioned over a portion of the floating gate electrode, as viewed from the substrate surface, in overlapping relation therewith.

2. A semiconductor non-volatile memory according to claim 1; wherein the opposed and overlapping portions of the erasing electrode and floating gate electrode are configured to effect the flow of electric charges in one direction through the first tunnel insulator film during an erasing operation, and the opposed and overlapping portions of the writing electrode and floating gate electrode are configured to effect the flow of electric charge in the same one direction through the second tunnel insulator film during a writing operation.

3. A semiconductor non-volatile memory according to claim 2; wherein the first and second tunnel insulator films each have a breakdown electric field characteristic which is greater when an electric field is applied thereacross in one direction than when the electric field is applied thereacross in the opposite direction; and wherein the floating gate, erasing and writing electrodes are positioned relative to the first and second tunnel insulator films to effect the flow of electric charges through the first tunnel insulator film during the erasing operation and through the second tunnel insulator film during the writing operation in the direction in which the breakdown electric field characteristic is greater to thereby reduce the likeiihood of breakdown of the first and second tunnel insulator films.

4. A semiconductor non-volatile memory comprising:
a semiconductor substrate of a first conductivity type having first, second and third polysilicon layers sequentially formed thereon;
source and drain regions of a second conductivity type formed in the surface of the semiconductor substrate and spaced apart from each other;
a floating gate electrode on the surface of the semiconductor substrate between the source and drain regions through a gate insulator film;
an erasing electrode comprised of the first layer and provided in opposed relation to the floating gate electrode with a first tunnel insulator film therebetween and operative to receive electric charges emitted from the floating gate electrode during an erasing operation, a portion of the erasing electrode being positioned under a portion of the floating gate electrode in overlapping relation therewith; and a writing electrode comprised of the third layer and provided in opposed relation to the floating gate electrode with a second tunnel insulator film therebetween and operative to inject electric charges into the floating gate electrode during a writing operation, a portion of the writing electrode being positioned over a portion of the floating gate electrode in overlapping relation therewith.

5. A semiconductor non-volatile memory according to claim 4; wherein the opposed and overlapping portions of the erasing electrode and floating gate electrode are configured to effect the flow of electric charges in one direction through the first tunnel insulator film during an erasing operation, and the opposed and overlapping portions of the writing electrode and floating gate electrode are configured to effect the flow of electric charge in the same one direction through the second tunnel insulator film during a writing operation.

6. A semiconductor non-volatile memory according to claim 5; wherein the first and second tunnel insulator films each have a breakdown electric field characteristic which is greater when an electric field is applied thereacross in one direction than when the electric field is applied thereacross in the opposite direction; and wherein the floating gate, erasing and writing electrodes are positioned relative to the first and second tunnel insulator films to effect the flow of electric charges through the first tunnel insulator film during the erasing operation and through the second tunnel insulator film during the writing operation in the direction in which the breakdown electric field characteristic is greater to thereby reduce the likelihood of breakdown of the first and second tunnel insulator films.

7. A semiconductor non-volatile memory comprising:
a semiconductor substrate of a first conductivity tape having a multi-layered polysilicon comprised of first, second and third layers sequentially disposed on the surface of the semiconductor substrate;
source and drain regions of a second conductivity type formed in the surface of the semiconductor substrate and spaced apart from each other;
a floating gate electrode formed from the second layer and disposed on the surface of the semiconductor substrate between the source and drain regions through a gate insulator film;
an erasing electrode formed from the first layer and disposed in opposed relation to the floating gate electrode with a tunnel insulator film therebetween and operative to receive electric charges emitted from the floating gate electrode during an erasing operation; and
writing means adjacent to the floating gate electrode and operative to inject electric charges into the floating gate electrode during a writing operation, the writing means comprising a writing electrode formed from the third layer and provided in opposed relation to the floating gate electrode with another tunnel insulator film therebetween.

* * * * *